(12) United States Patent
Koga

(10) Patent No.: US 6,512,423 B2
(45) Date of Patent: Jan. 28, 2003

(54) PRINTED BOARD, METHOD FOR PRODUCING THE SAME, AND ELECTRONIC DEVICE HAVING THE SAME

(75) Inventor: Yuichi Koga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/963,641

(22) Filed: Sep. 27, 2001

(65) Prior Publication Data

US 2002/0050870 A1 May 2, 2002

(30) Foreign Application Priority Data

Sep. 28, 2000 (JP) ........................................ 2000-296363

(51) Int. Cl.[7] ................................................. H01P 3/08
(52) U.S. Cl. ........................... 333/1; 333/116; 333/118; 333/120; 333/136; 333/33; 333/34; 333/246; 333/238
(58) Field of Search ............................. 333/1, 33, 161, 333/34, 238, 116, 118, 120, 136, 246

(56) References Cited

U.S. PATENT DOCUMENTS

| | | | | |
|---|---|---|---|---|
| 3,179,904 A | * | 4/1965 | Pausen | 333/1 |
| 3,191,055 A | * | 6/1965 | Swihart et al. | 333/238 |
| 3,459,879 A | * | 8/1969 | Gerpheide | 333/1 |
| 4,490,690 A | * | 12/1984 | Suzuki | 333/1 |
| 4,703,288 A | * | 10/1987 | Frye et al. | 333/1 |
| 5,270,672 A | * | 12/1993 | Schinzel | 333/246 |
| 5,426,399 A | * | 6/1995 | Matsubayashi et al. | 333/1 |
| 5,519,363 A | * | 5/1996 | Boudreau et al. | 333/1 |
| 5,634,208 A | * | 5/1997 | Nishikawa et al. | 333/1 |
| 5,777,526 A | | 7/1998 | Kawasaki | |

* cited by examiner

Primary Examiner—Michael Tokar
Assistant Examiner—Lam T. Mai
(74) Attorney, Agent, or Firm—Finnegan, Henderson, Farabow, Garrett & Dunner, L.L.P.

(57) ABSTRACT

A printed board having a structure for equalizing propagation times on transmission lines connecting the same pair of circuit elements at several terminals. The structure controls each propagation delay by connecting each transmission line partially in different dielectric layers having different dielectric constants in a multi-layered printed board regardless of a distance between the terminals to be connected.

21 Claims, 5 Drawing Sheets $\varepsilon_A = \varepsilon_B = \varepsilon_C$ $\varepsilon_D = \varepsilon_E = \varepsilon_F < \varepsilon_G = \varepsilon_H$

PRINTED BOARD, METHOD FOR PRODUCING THE SAME, AND ELECTRONIC DEVICE HAVING THE SAME

CROSS-REFERENCE TO RELATED APPLICATIONS

This application is based upon and claims the benefit of priority from the prior Japanese Patent Application No. 2000-296363, filed on Sep. 28, 2000, the entire contents of which are incorporated herein by reference.

BACKGROUND OF THE INVENTION

1. Field of the Invention

The invention relates to a printed board for transmitting signals. More particularly, the invention relates to a printed board for transmitting signals, the printed board which has a structure for practically equalizing propagation times of transmission lines connecting the same pair of circuit elements, a method for producing the printed board, and an electronic device that includes the printed board.

2. Description of the Related Art

Each high frequency transmission line, such as a CPU bus, for connecting a pair of circuit elements arranged on a printed board is prescribed with an allowable delay between a driver and a receiver. The delay includes a delay that occurs on the transmission line, namely, a wiring delay, as well as delays due to unique buffer characteristics of the driver and receiver.

Each wiring delay is prescribed with both a maximum value (maximum propagation time) and a minimum value (minimum propagation time) in consideration of characteristics of corresponding circuit elements. Accordingly, in conventional designing of printed boards, the maximum length and the minimum length of each transmission line between two circuit elements are determined by focusing on a propagation delay of each transmission line. The propagation delay is a value indicating how far a signal advances within a predetermined time.

For example, if two circuit elements are connected together at their terminals via two transmission lines, positions of a more distant pair of corresponding terminals are first determined, which provides the maximum transmission line length between the circuit elements. This determines a physical distance between these two circuit elements. Then positions of another pair of terminals are determined to provide the minimum transmission line length between the circuit elements. This may result in the transmission line meandering on the printed board. However, the meandering, or routing, requires an additional wiring space and causes unnecessary signal reflection.

A propagation delay $T_d$ of a transmission line is expressed by the following formula:

$$T_d = (L \times \sqrt{\in_r})/c \quad (1)$$

The terms L, $\in_r$, and c respectively represent a length of the transmission line, a dielectric constant in the neighborhood of the transmission line, i.e., of the dielectric layer(s) through which the transmission line passes, and the velocity of light. Therefore the propagation delay can be adjusted by controlling the dielectric constant $\in_r$ as well as the transmission line length L.

In consideration of such a condition, Japanese laid-open patent publication No. 11-8444 discloses a technique of equalizing propagation delays on every high frequency electrical wire. According to the publication, a dielectric layer is divided between electrical wires and a dielectric constant of each divided dielectric layer is changed according to a length of each electrical wire. The publication is based on the propagation delay $T_d$ of a signal on the electrical wire being proportional to the square root of the dielectric constant $\in_r$ in the neighborhood of the electrical wire, as shown by formula (1).

As mentioned above, in the publication, dielectric constants of two insulators adjacent to each other in the same layer are different in order to adjust the propagation delay of each electrical wire. However, it is difficult to actually form a substrate having such a layer structure.

SUMMARY OF THE INVENTION

In accordance with the present invention, there is provided a printed board. The printed board comprises: a first dielectric layer having a dielectric constant larger than that of air, the layer having an upper surface and a lower surface; a first conducting layer formed under the lower surface of the first dielectric layer; a second dielectric layer, formed under the first conducting layer, having a dielectric constant larger than that of air; a second conducting layer formed under the second dielectric layer; a first circuit element having at least first and second terminals mounted on the upper surface of the first dielectric layer; a second circuit element, mounted on the upper surface of the first dielectric layer, having at least first and second terminals to be respectively paired with the first and second terminals of the first circuit element; a first transmission line, on the upper surface of the first dielectric layer, connecting the first terminals of the first and second circuit elements; and a second transmission line connecting the second terminals of the first and second circuit elements and being routed through the first dielectric layer, the first conducting layer, and the second dielectric layer, a distance between the second terminals of the first and second circuit elements being shorter than a distance between the first terminals of the first and second circuit elements.

Also in accordance with the present invention, there is provided a method for producing a printed board. The method for producing a printed board comprises: forming a first dielectric layer having a dielectric constant larger than that of air, the layer having an upper surface and a lower surface; forming a first conducting layer under the lower surface of the first dielectric layer; forming a second dielectric layer under the first conducting layer, the second dielectric layer having a dielectric constant larger than that of air; forming a second conducting layer under the second dielectric layer; mounting a first circuit element having at least first and second terminals on the upper surface of the first dielectric layer; mounting a second circuit element on the upper surface of the first dielectric layer, the second circuit element having at least first and second terminals to be respectively paired with the first and second terminals of the first circuit element; connecting the first terminals of the first and second circuit elements with a first transmission line on the upper surface of the first dielectric layer; and connecting the second terminals of the first and second circuit elements with a second transmission line routed through the first dielectric layer, the first conducting layer, and the second dielectric layer, a distance between the second terminals of the first and second circuit elements being shorter than a distance between the first terminals of the first and second circuit elements.

Further in accordance with the present invention, there is provided an electronic device. The electronic device comprises: a case; a first circuit element having at least first and second terminals; a second circuit element having at least first and second terminals to be respectively paired with the first and second terminals of the first circuit element; and a printed board mounted in the case. The printed board includes: a first dielectric layer having a dielectric constant larger than that of air, the first dielectric layer having an upper surface, on which the first circuit element and the second circuit element are mounted, and a lower surface; a first conducting layer formed under the lower surface of the first dielectric layer; a second dielectric layer, formed under the first conducting layer, having a dielectric constant larger than that of air; a second conducting layer formed under the second dielectric layer; a first transmission line, on the upper surface of the first dielectric layer, connecting the first terminals of the first and second circuit elements; and a second transmission line connecting the second terminals of the first and second circuit elements and being routed through the first dielectric layer, the first conducting layer, and the second dielectric layer, a distance between the second terminals of the first and second circuit elements being shorter than a distance between the first terminals of the first and second circuit elements.

BRIEF DESCRIPTION OF THE DRAWINGS

The accompanying drawings, which are incorporated in and constitute part of this specification, illustrate various embodiments and/or features of the invention and together with the description, serve to explain the principles of the invention. In the drawings.

DETAILED DESCRIPTION

Figure 1:
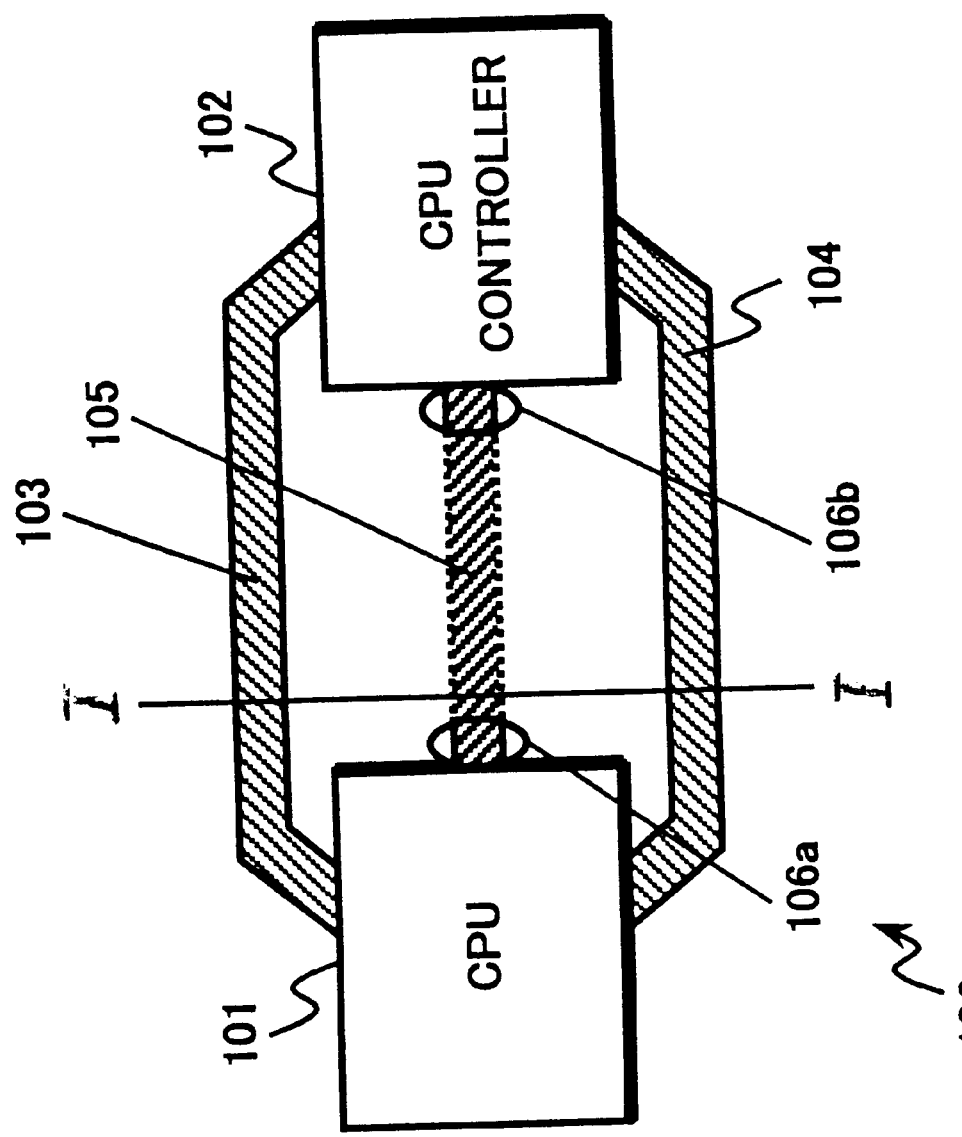
FIG. 1 is a plan view showing an arrangement of circuit elements on a printed board for transmitting signals consistent with a first embodiment of the present invention.
Figure 2:
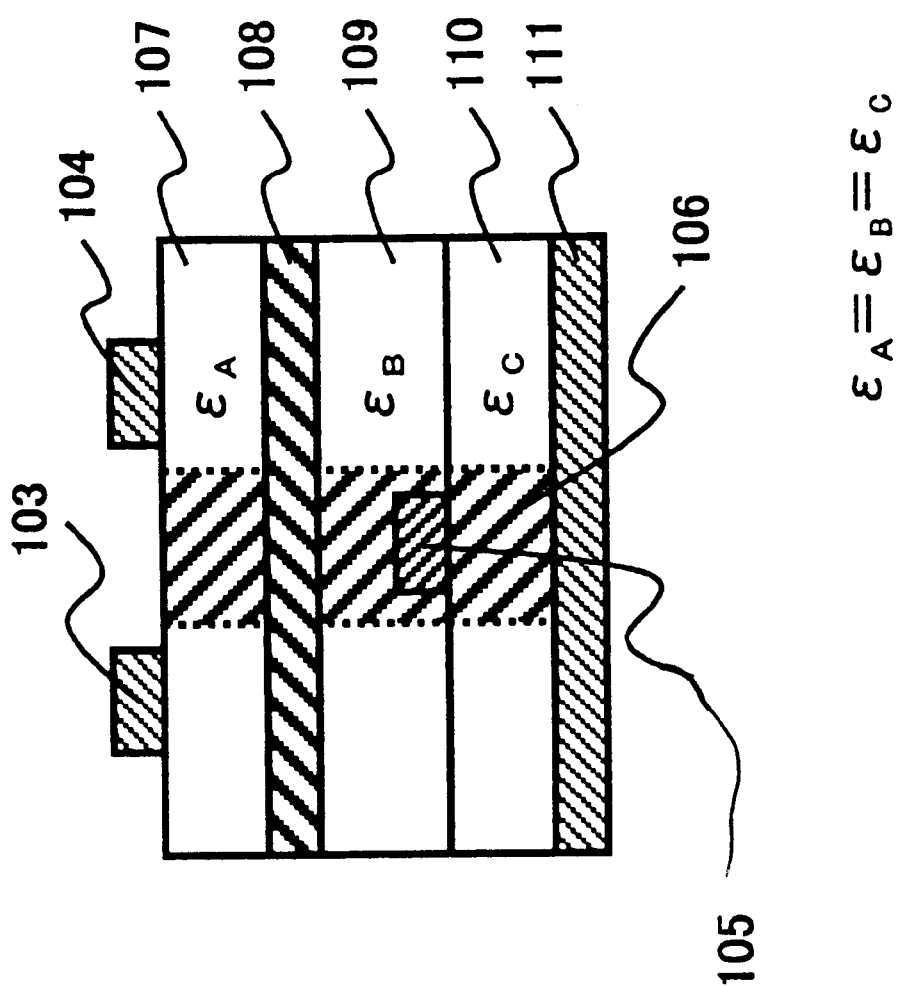
FIG. 2 is section I—I of FIG. 1 showing a layer structure of the printed board for transmitting signals consistent with the first embodiment.

FIG. 1 is a plan view showing an arrangement of circuit elements on a four-layered printed board for transmitting signals consistent with a first embodiment of the present invention, and FIG. 2 is a section view of the printed board taken along line I—I of FIG. 1(a) showing a layer structure consistent with the first embodiment. In FIG. 1, three terminals of a CPU 101 and three terminals of a CPU controller 102 are connected, respectively, via three transmission lines 103, 104, and 105, meeting the specification for propagation time. The transmission line 105 connects the nearest pair of terminals through a pair of vias 106a and 106b, which are formed in the neighborhood of the terminals, in the printed board. Each of the transmission lines 103 and 104 respectively connects the remaining pairs of terminals on the printed board. Via is a general term for a through-hole or a built-up type hole.

In FIG. 2, the first layer is a wiring layer composed of a surface layer pattern and a dielectric layer 107. The surface layer pattern is composed of transmission lines 103 and 104 that are $\mu$ strip lines. The second layer is a power supply/ground layer composed of a conducting layer 108 and a dielectric layer 109. The third layer is an intermediate layer composed of the transmission line 105 that is a $\mu$ strip line and a dielectric layer 110. The fourth layer is a substrate conductor 111.

The dielectric layers 107, 109, and 110 have dielectric constants $\in_A$, $\in_B$, and $\in_C$, respectively. Generally, the dielectric constant of an insulator used in a printed board is 3.0 to 4.8 and the dielectric constants of two adjacent layers are designed to be nearly equal to each other. The insulator may be made of various materials, for example, FR4 ($\in_r$=4.5), halogen free ($\in_r$=4.1), and dielectric film ($\in_r$=3.0 to 3.3). The numerical value in parentheses following each material indicates a representative value of the dielectric constant $\in_r$ for that material.

Therefore, according to formula (1), compared with the transmission lines 103 or 104 formed as the first layer in contact with air having a dielectric constant of $\in_{air}$=1, the transmission line 105 formed on the third layer located between the dielectric layers 109 and 110 each having a dielectric constant $\in_B=\in_C$=3.0 to 4.8, has a larger propagation delay. By forming a transmission line partially in an intermediate wiring layer like the transmission line 105, the length of the transmission line can be adjusted to have the same propagation delay as that of the surface layer pattern. That is, the propagation delays of the transmission lines 103, 104, and 105 can be equal to each other.

According to this embodiment, a propagation delay can be adjusted by wiring a pair of terminals through dielectric layers having different dielectric constants according to the distance between the terminals. As a result, unnecessary routing can be reduced and time for adjusting the transmission line lengths can be reduced as well. Moreover, in this case, there is no need to make the dielectric constants of the dielectric layers different. Further, because they are structured on the substrate in layers, no special technique for manufacturing substrates is necessary. Therefore, the propagation delay occurring on each transmission line can be adjusted at a low cost.

The dielectric constant and width of each dielectric layer can be also controlled in order to increase the degrees of freedom of propagation delay adjustment. An impedance Z of a $\mu$ strip line within a dielectric layer is expressed by the following formula:

$$Z = \frac{87}{\sqrt{\varepsilon r + 1.41}} \times \mathrm{Log}_n\left(5.98 \times \frac{H}{0.8 \times W + T}\right) \quad (2)$$

In formula (2), the terms 'H', 'W', and 'T' respectively indicate a thickness of the dielectric layer, a width of the transmission line, and a wiring thickness. The relation among the impedance Z, the inductance L, and the capacitance C of the $\mu$ strip line is expressed by the following formula (3):

$$Z=\sqrt{(L/C)} \quad (3)$$

The relation among the propagation delay $T_d$, the inductance L, and the capacitance C is expressed by the following formula (4):

$$T_d=\sqrt{(L \times C)} \quad (4)$$

Figure 3:
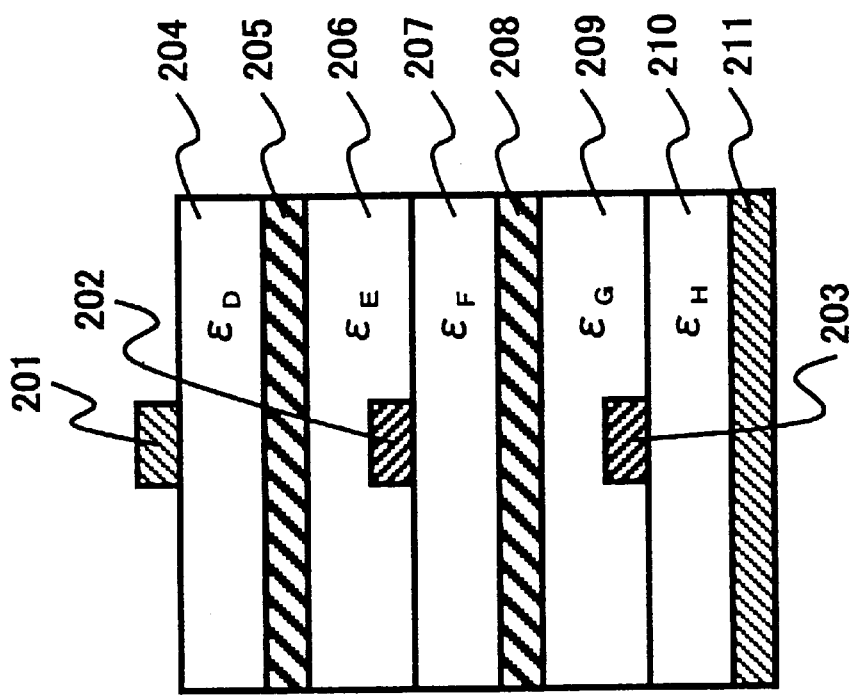
FIG. 3 is a section view showing a layer structure of the printed board for transmitting signals consistent with a second embodiment.

Next, a method for controlling the dielectric constant of the dielectric layer to adjust propagation delay will be explained. FIG. 3 is a section view showing a layer structure of a six-layered printed board for transmitting signals consistent with a second embodiment of the present invention. In this case, three terminals of a first device, e.g., the CPU 101, and three terminals of a second device, e.g., CPU controller 102, are connected via three transmission lines 201, 202, and 203, respectively. In this structure, transmission line 201 is assumed to be longer than transmission line 202.

In FIG. 3, the first layer is a wiring layer composed of a surface layer pattern and a dielectric layer 204. The surface layer pattern is composed of the transmission line 201 that is a $\mu$ strip line. The second layer is a first power supply/ground layer composed of a conducting layer 205 and a dielectric layer 206. The third layer is a first intermediate wiring layer composed of the transmission line 202 that is a $\mu$ strip line and a dielectric layer 207. The fourth layer is a second power supply/ground layer composed of a conducting layer 208 and a dielectric layer 209. The fifth layer is a second intermediate wiring layer composed of the transmission line 203 that is a $\mu$ strip line and a dielectric layer 210. The sixth layer is a substrate conductor 211.

The dielectric layers 204, 206, 207, 209, and 210 have dielectric constants $\in_D$, $\in_E$, $\in_F$, $\in_G$, and $\in_H$, respectively. When the dielectric constants of these dielectric layers are equal to each other, the propagation delay on the transmission line 201 is smaller than those of the transmission lines 202 and 203, which are equal to each other. However, the propagation delay on the transmission line 202 can be larger than that of the transmission line 201 and smaller than that of the transmission lines 203, for example, by designing the dielectric constants to partially differ, such as $\in_D=\in_E=\in_F<\in_G=\in_H$. Inversely, the dielectric constants may be designed to be $\in_D=\in_E=\in_F>\in_G=\in_H$. In these cases, an FR4, a halogen free, and a dielectric film can be used in combination as insulating materials.

According to this embodiment, transmission lines formed in intermediate wiring layers, such as transmission line 202 and transmission line 203, can be designed to have propagation delays different from each other by controlling the dielectric constants of the dielectric layers surrounding these transmission lines. This technique is more effective in a case where wiring on the substrate surface, such as the transmission line 201, is prohibited in order to reduce reflection caused by each transmission line contacting air. The dielectric layers having different dielectric constants can be easily formed in layers.

Figure 4:
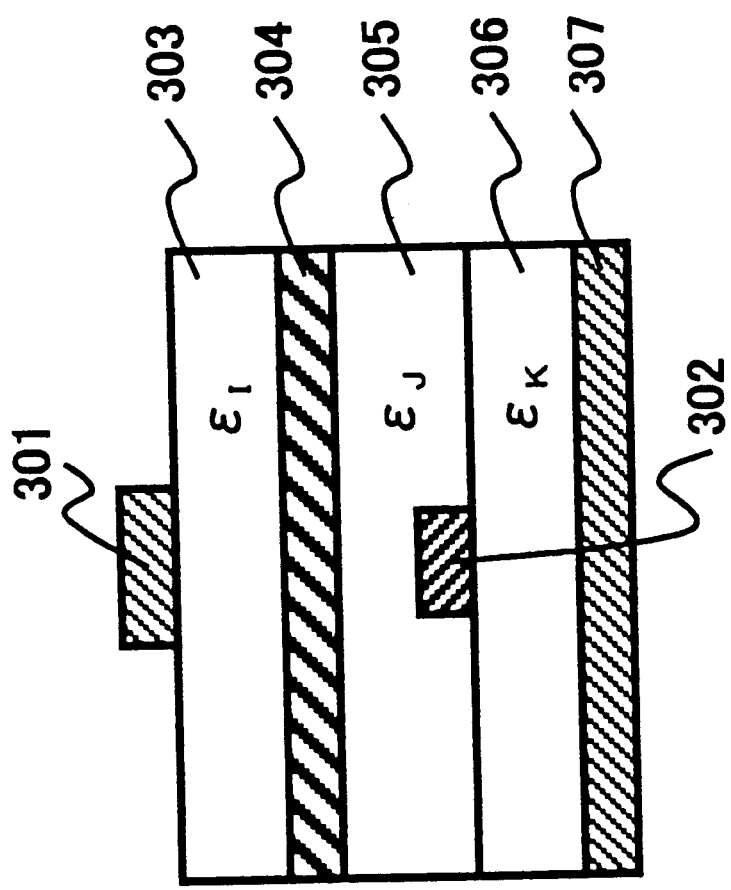
FIG. 4 is a section view showing a layer structure of the printed board for transmitting signals consistent with a third embodiment.

Next, a method for controlling the width of a transmission line to adjust the propagation delay will be explained. FIG. 4 is a section showing an example of a layer structure of a six-layered printed board for transmitting signals consistent with a third embodiment of the present invention. Two circuit elements (not shown in FIG. 4) are connected via two transmission lines 301 and 302 respectively.

In FIG. 4, the first layer is a wiring layer composed of a surface layer pattern and a dielectric layer 303. The surface layer pattern is composed of the transmission line 301 that is $\mu$ strip line. The second layer is a power supply/ground layer composed of a conducting layer 304 and a dielectric layer 305. The third layer is an intermediate wiring layer composed of the transmission line 302 that is a strip line and a dielectric layer 306. The fourth layer is a substrate conductor 307.

The dielectric layers 303, 305, and 306 have dielectric constants $\in_I$, $\in_J$, and $\in_K$, respectively. The dielectric constants of the layers 303, 305, and 306 are equal to each other and the transmission lines 301 and 302 are different in width.

According to formula (2), when there are two transmission lines having different widths in the same layer, the impedance Z of the wider transmission line is lower. According to formulas (3) and (4), the propagation delay $T_d$ of a narrow transmission line is larger. According to this embodiment, the propagation delay occurring on a transmission line can be controlled more finely by adjusting the width of the transmission line based on the above characteristics. Thus, the second and third embodiments can be properly applied to the first embodiment in order to improve the degrees of freedom of propagation delay adjustment.

Figure 5:
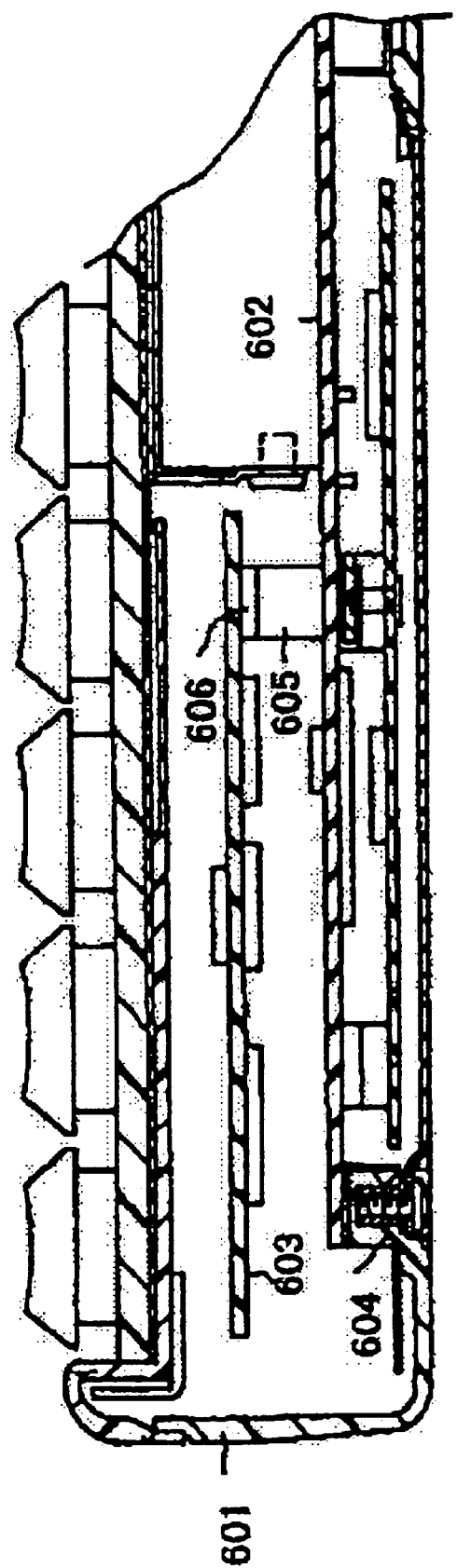
FIG. 5 is a section view showing a computer case with a printed board mounted therein for transmitting signals consistent with embodiments of the invention.

FIG. 5 is a section view showing a computer case in which is mounted a printed board for transmitting signals consistent with the present invention. As shown in FIG. 5, a case 601 has a shape of a hollow box and printed boards 602 and 603 are mounted therein. The printed board 602 is fixed to the case 601 by a supporting unit 604 installed in the case 601 and the printed board 603 is fixed by fitting of stacking connectors 605 and 606.

Therefore, the processing capacity of the computer itself can be improved by mounting therein a high-performance printed board, on which the area occupied by transmission lines is small, and which can suppress both deterioration of high frequency characteristics and transmission errors by selectively equalizing propagation times of transmission lines.

According to embodiments of the invention, because transmission lines are formed in wiring layers having different dielectric constants in a multi-layered printed board depending on the distance between paired terminals of circuit elements to be connected, the transmission line route on the printed board can be simplified. As a result, reduction of the area occupied by transmission lines and reduction in unnecessary reflection can be realized.

It will be apparent to those skilled in the art that various modifications and variations can be made in the apparatus and method of the present invention without departing from the spirit or scope of the invention. Thus, it is intended that the present invention cover the modifications and variations of this invention provided they come within the scope of the appended claims and their equivalents.

What is claimed is:

1. A printed board, comprising:
   a first dielectric layer having a dielectric constant larger than that of air, the layer having an upper surface and a lower surface;
   a first conducting layer formed under the lower surface of the first dielectric layer;
   a second dielectric layer, formed under the first conducting layer, having a dielectric constant larger than that of air;
   a second conducting layer formed under the second dielectric layer;
   a first circuit element having at least first and second terminals mounted on the upper surface of the first dielectric layer;
   a second circuit element, mounted on the upper surface of the first dielectric layer, having at least first and second terminals to be respectively paired with the first and second terminals of the first circuit element;
   a first transmission line, on the upper surface of the first dielectric layer, connecting the first terminals of the first and second circuit elements; and
   a second transmission line connecting the second terminals of the first and second circuit elements and being routed through the first dielectric layer, the first conducting layer, and the second dielectric layer, a distance between the second terminals of the first and second circuit elements being shorter than a distance between the first terminals of the first and second circuit elements.

2. The printed board of claim 1, wherein:
propagation times on the first and second transmission lines are substantially equal to each other.

3. The printed board of claim 1, wherein:
propagation delays on the first and second transmission lines are substantially equal to each other, each delay being expressed by $$T_d = (L \times \sqrt{\in_r})/c$$

wherein terms $T_d$, $L$, $\in_r$, and c are a propagation delay, a transmission line length, a dielectric constant in a neighborhood of the first or second transmission line for which $T_d$ is being determined, and light speed, respectively.

4. The printed board of claim 1, wherein:
the second dielectric layer is composed of an upper layer and a lower layer; and
the second transmission line connects the first and second circuit elements partially on the lower layer through the first dielectric layer and the first conducting layer.

5. The printed board of claim 1, wherein:
the first circuit element is a CPU; and
the second circuit element is a CPU controller.

6. The printed board of claim 1, wherein:
the first transmission line is a $\mu$ strip line and the second transmission line is a strip line.

7. The printed board of claim 1, wherein:
the first transmission line is wider than the second transmission line.

8. The printed board of claim 1, wherein:
the dielectric constant of the first dielectric layer is smaller than the dielectric constant of the second dielectric layer.

9. The printed board of claim 1, wherein:
the dielectric constants of the first and second dielectric layers are substantially equal.

10. The printed board of claim 9, wherein:
the dielectric constant of the first dielectric layer is between 3.0 and 4.8.

11. The printed board of claim 1, wherein:
the first circuit element has a third terminal;
the second circuit element has a third terminal to be paired with the third terminal of the first circuit element;
the printed board, further comprising:
 a third dielectric layer having a dielectric constant larger than that of air and formed under the second conducting layer;
 a third conducting layer formed under the second dielectric layer; and
 a third transmission line connecting the third terminals of the first and second circuit elements through the first dielectric layer, the first conducting layer, the second dielectric layer, the second conducting layer, and the third dielectric layer, a distance between the third terminals of the first and second circuit elements being shorter than a distance between the second terminals of the first and second circuit elements.

12. The printed board of claim 11, wherein:
the dielectric constants of the first, second, and third dielectric layers are substantially the same.

13. The printed board of claim 11, wherein:
the dielectric constants of the first and second dielectric layers are substantially the same, and the dielectric constant of the third dielectric layer is larger than each of the dielectric constants of the first and second dielectric layers.

14. A method for producing a printed board, comprising:
forming a first dielectric layer having a dielectric constant larger than that of air, the layer having an upper surface and a lower surface;
forming a first conducting layer under the lower surface of the first dielectric layer;
forming a second dielectric layer under the first conducting layer, the second dielectric layer having a dielectric constant larger than that of air;
forming a second conducting layer under the second dielectric layer;
mounting a first circuit element having at least first and second terminals on the upper surface of the first dielectric layer;
mounting a second circuit element on the upper surface of the first dielectric layer, the second circuit element having at least first and second terminals to be respectively paired with the first and second terminals of the first circuit element;
connecting the first terminals of the first and second circuit elements with a first transmission line on the upper surface of the first dielectric layer; and
connecting the second terminals of the first and second circuit elements with a second transmission line routed through the first dielectric layer, the first conducting layer, and the second dielectric layer, a distance between the second terminals of the first and second circuit elements being shorter than a distance between the first terminals of the first and second circuit elements.

15. The method of claim 14, wherein:
the forming of the second dielectric layer includes forming an upper layer of the second dielectric layer and forming a lower layer of the second dielectric layer; and
the connecting includes partially routing the second transmission line on the lower layer.

16. The method of claim 14, further comprising:
equalizing propagation times of the first and second transmission lines.

17. The method of claim 14, further comprising:
equalizing propagation delays of the first and second transmission lines, wherein a delay on each of the first and second transmission lines is $$T_d = (L \times \sqrt{\in_r})/c$$

wherein terms $T_d$, $L$, $\in_r$, and c are a propagation delay, a transmission line length, a dielectric constant in a neighborhood of the first or second transmission line for which $T_d$ is being determined, and light speed, respectively.

18. The method of claim 14, wherein:
mounting the first circuit element includes providing the first circuit element having a third terminal;
mounting the second circuit element includes providing the second circuit element having a third terminal to be paired with the third terminal of the first circuit element;
the method further comprising:

forming a third dielectric layer having a dielectric constant larger than that of air and under the second conducting layer;

forming a third conducting layer under the second dielectric layer; and forming a third transmission line connecting the third terminals of the first and second circuit elements through the first dielectric layer, the first conducting layer, the second dielectric layer, the second conducting layer, and the third dielectric layer, a distance between the third terminals of the first and second circuit elements being shorter than a distance between the second terminals of the first and second circuit elements.

19. An electronic device, comprising:

a case;

a first circuit element having at least first and second terminals;

a second circuit element having at least first and second terminals to be respectively paired with the first and second terminals of the first circuit element;

a printed board mounted in the case, including:
 a first dielectric layer having a dielectric constant larger than that of air, the first dielectric layer having an upper surface, on which the first circuit element and the second circuit element are mounted, and a lower surface;
 a first conducting layer formed under the lower surface of the first dielectric layer;
 a second dielectric layer, formed under the first conducting layer, having a dielectric constant larger than that of air;
 a second conducting layer formed under the second dielectric layer;
 a first transmission line, on the upper surface of the first dielectric layer, connecting the first terminals of the first and second circuit elements; and
 a second transmission line connecting the second terminals of the first and second circuit elements and being routed through the first dielectric layer, the first conducting layer, and the second dielectric layer, a distance between the second terminals of the first and second circuit elements being shorter than a distance between the first terminals of the first and second circuit elements.

20. The device of claim 19, wherein:

propagation times of the first and second transmission lines are substantially equal to each other.

21. The device of claim 19, wherein:

propagation delays of the first and second transmission lines are substantially equal to each other, each propagation delay being expressed by $$T_d = (L \times \sqrt{\in_r})/c$$

wherein terms $T_d$, $L$, $\in_r$, and c are a propagation delay, a transmission line length, a dielectric constant in a neighborhood of the first or second transmission line for which $T_d$ is being determined, and light speed, respectively.

* * * * *